US009236154B2

(12) United States Patent
Nakada et al.

(10) Patent No.: US 9,236,154 B2
(45) Date of Patent: Jan. 12, 2016

(54) CHARGED-PARTICLE BEAM DRAWING METHOD, COMPUTER-READABLE RECORDING MEDIA, AND CHARGED-PARTICLE BEAM DRAWING APPARATUS

(71) Applicant: NuFlare Technology, Inc., Shizuoka (JP)

(72) Inventors: Sumito Nakada, Kanagawa (JP); Osamu Iizuka, Kanagawa (JP); Hikaru Yamamura, Kanagawa (JP)

(73) Assignee: NUFLARE TECHNOLOGY, INC., SHIZUOKA (JP)

( * ) Notice: Subject to any disclaimer, the term of this patent is extended or adjusted under 35 U.S.C. 154(b) by 220 days.

(21) Appl. No.: 13/737,707

(22) Filed: Jan. 9, 2013

(65) Prior Publication Data

US 2013/0177855 A1    Jul. 11, 2013

(30) Foreign Application Priority Data

Jan. 10, 2012    (JP) .................. 2012-002290

(51) Int. Cl.
| | |
|---|---|
| *G21K 5/04* | (2006.01) |
| *G21K 5/10* | (2006.01) |
| *H01J 37/317* | (2006.01) |
| *B82Y 10/00* | (2011.01) |
| *B82Y 40/00* | (2011.01) |

(52) U.S. Cl.
CPC . *G21K 5/10* (2013.01); *B82Y 10/00* (2013.01); *B82Y 40/00* (2013.01); *H01J 37/3174* (2013.01); *H01J 2237/30455* (2013.01); *H01J 2237/31761* (2013.01); *H01J 2237/31776* (2013.01); *H01J 2237/31796* (2013.01)

(58) Field of Classification Search
USPC ............... 250/492.1, 492.2, 492.22, 492.3
See application file for complete search history.

(56) References Cited

U.S. PATENT DOCUMENTS

| | | | |
|---|---|---|---|
| 2010/0209833 A1 | 8/2010 | Kurohori | |
| 2012/0286170 A1* | 11/2012 | Van De Peut et al. | ........ 250/397 |

FOREIGN PATENT DOCUMENTS

| | | |
|---|---|---|
| JP | H09-260247 A | 10/1997 |
| JP | 2010-192666 | 9/2010 |
| JP | 2011-066054 | 3/2011 |

OTHER PUBLICATIONS

JP Office Action dated Aug. 12, 2015 for Application No. 2012-002290.

* cited by examiner

*Primary Examiner* — Nicole Ippolito
*Assistant Examiner* — Hanway Chang
(74) *Attorney, Agent, or Firm* — Patterson & Sheridan, LLP

(57) ABSTRACT

A charged-particle beam drawing method includes: storing a plurality of time interval patterns defining time intervals for performing a diagnosis of a drift amount of charged-particle beam; drawing a predetermined drawing pattern on a sample by irradiating the beam on the sample; receiving first event information including occurrence of event and type of event; acquiring region information specifying a region being drawn by the beam; selecting a specific time interval pattern from the plurality of time interval patterns based on the type of the event of the first event information and the region information; diagnosing the drift amount of the beam based on the specific time interval pattern, until second event information is received, the second event information includes occurrence of event and type of event; and drawing a predetermined drawing pattern on the sample while performing a drift correction of the charged-particle beam, based on the diagnosing.

6 Claims, 4 Drawing Sheets

CHARGED-PARTICLE BEAM DRAWING METHOD, COMPUTER-READABLE RECORDING MEDIA, AND CHARGED-PARTICLE BEAM DRAWING APPARATUS

CROSS-REFERENCE TO RELATED APPLICATION

This application is based upon and claims the benefit of priority from Japanese Patent Application No. 2012-002290, filed on Jan. 10, 2012, the entire contents of which are incorporated herein by reference.

FIELD OF THE INVENTION

Embodiments described herein relate generally to a charged-particle beam drawing method, a computer-readable recording media, and a charged-particle beam drawing apparatus.

BACKGROUND OF THE INVENTION

In order to form a desired circuit pattern on a semiconductor device, a lithography technique is used. The lithography technique transfers a pattern using an original pattern, called a mask (reticle). In order to manufacture a high-precision reticle, an electron beam drawing technique having excellent resolution is used.

As one method of an electron beam drawing apparatus which performs an electron beam drawing on a mask, there is a variable-shaped method. In the variable-shaped method, for example, a pattern is drawn on a sample placed on a movable stage by electron beam which is formed by passing through openings of first and second formation apertures and deflection-controlled by a polarizer. One-time irradiation of electron beam is referred to as shot.

During drawing onto the mask or during waiting for drawing, a drift (or beam drift) may occur. That is, an electron beam irradiation position may be deviated from a desired position. For example, when electron beam is irradiated on the mask, reflected electrons are generated. The generated reflected electrons collide against an optical system or a detector within the electron beam drawing apparatus. Therefore, a charge-up is generated and a undesired electric field is generated accordingly. In this case, the trajectory of the electron beam irradiated with deflection toward the mask is changed. As such, the charge-up is one cause of the electron beam drift.

If a drift amount of the electron beam exceeds an allowable range, pattern drawing accuracy is degraded. Therefore, a drift diagnosis for monitoring the drift amount of the electron beam during drawing is performed. As a result of the drift diagnosis, a drift correction is performed to correct the drift according to the obtained drift amount.

JP-A 2010-192666 discloses an electron beam drawing method which changes a time interval of drift correction according to an amount of change in an area density of a region to draw on.

SUMMARY OF THE INVENTION

A charged-particle beam drawing method according to an aspect of the present disclosure includes, storing a plurality of time interval patterns defining time intervals for performing a diagnosis of a drift amount of charged-particle beam; drawing a predetermined drawing pattern on a sample by irradiating the charged-particle beam on the sample; receiving first event information including occurrence of event and type of event; acquiring region information specifying a region being drawn by the charged-particle beam; selecting a specific time interval pattern from the plurality of time interval patterns based on the type of the event of the first event information and the region information; diagnosing the drift amount of the charged-particle beam based on the specific time interval pattern, after the reception of the first event information until second event information is received, the second event information includes occurrence of event and type of event; and drawing a predetermined drawing pattern on the sample while performing a drift correction of the charged-particle beam, based on the diagnosing.

A computer-readable recording media storing a charged-particle beam drawing program, which causes a computer mounted on a charged-particle beam drawing apparatus to execute according to an aspect of the present disclosure includes, storing a plurality of time interval patterns defining time intervals for performing a diagnosis of a drift amount of charged-particle beam; drawing a predetermined drawing pattern on a sample by irradiating the charged-particle beam on the sample; receiving first event information including occurrence of event and type of event; acquiring region information specifying a region being drawn by the charged-particle beam; selecting a specific time interval pattern from the plurality of time interval patterns based on the type of the event of the first event information and the region information; diagnosing the drift amount of the charged-particle beam based on the specific time interval pattern, after the reception of the first event information until second event information is received, the second event information includes occurrence of event and type of event; and drawing a predetermined drawing pattern on the sample while performing a drift correction of the charged-particle beam, based on the diagnosing.

A charged-particle beam drawing apparatus according to an aspect of the present disclosure includes: a storage unit stores a plurality of time interval patterns defining time intervals for performing a diagnosis of a drift amount of charged-particle beam; an event information reception unit receives first event information including occurrence of event and type of event; a region information acquisition unit acquires region information specifying a region being drawn by the charged-particle beam; a time interval pattern selection unit selects a specific time interval pattern from the plurality of time interval patterns based on the type of the event of the first event information and the region information; a drift diagnosis control unit diagnoses the drift amount of the charged-particle beam after the reception of the first event information until second event information is received; and a drawing unit draws a predetermined drawing pattern on a sample while performing a drift correction of the charged-particle beam, based on diagnosis performed by the rift diagnosis control unit.

DETAILED DESCRIPTION OF THE EMBODIMENTS

Figure 1:
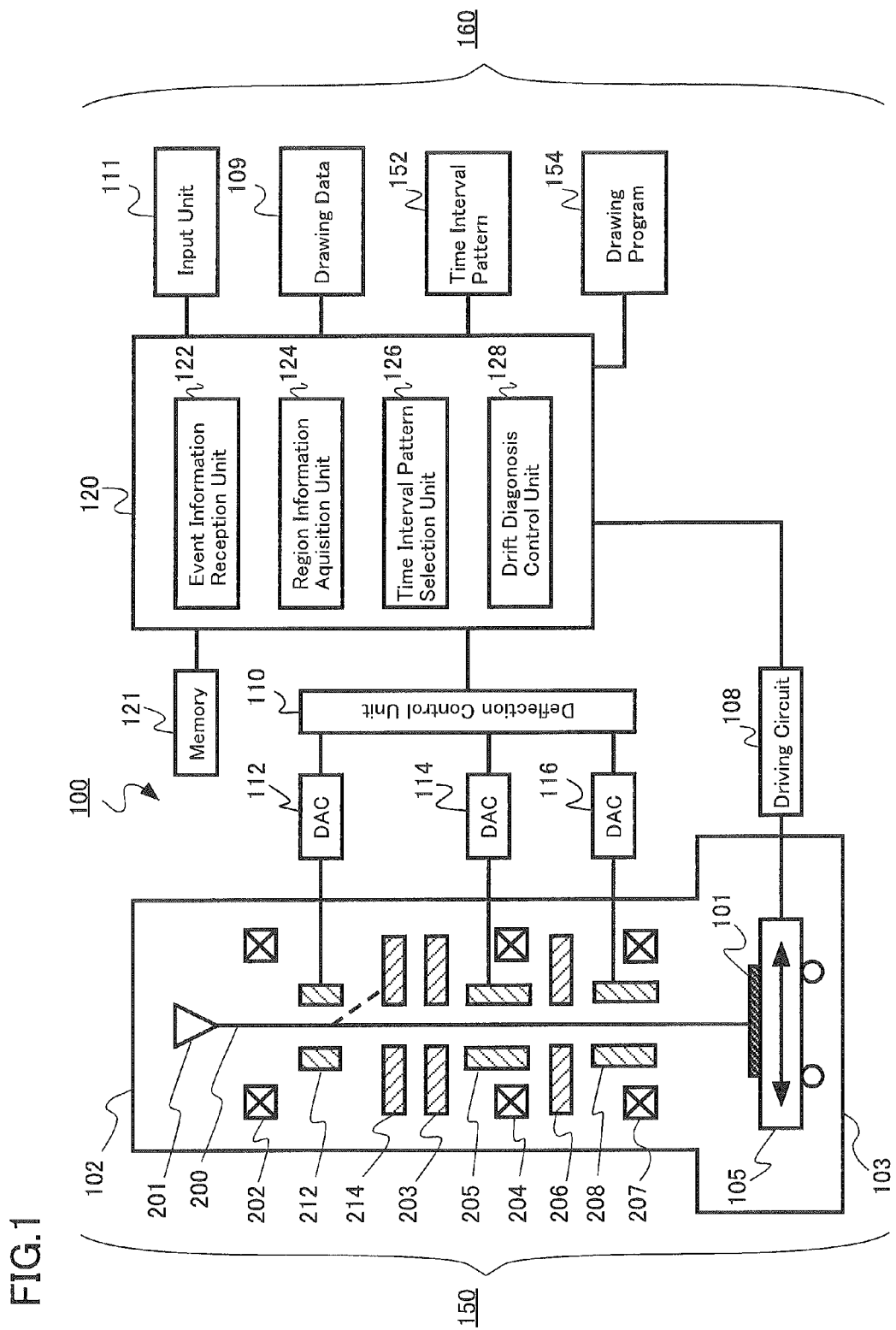
FIG. 1 is a conceptual diagram illustrating a configuration of a drawing apparatus according to an embodiment.

As a drawing pattern becomes finer, an allowable amount of drift becomes smaller. Therefore, it is desirable to shorten a time interval of a drift diagnosis during drawing. However, if the time interval is shortened, drawing throughput is worsened. Consequently, for example, there is a problem that a manufacturing cost of a mask is increased.

Hereinafter, an embodiment of the present disclosure will be described with reference to the drawings. Hereinafter, in the embodiment, a configuration using electron beam as one example of charged-particle beam will be described. However, the charged-particle beam is not limited to the electron beam but may also be beam using charged particle such as ion beam.

Further, in the embodiment, a mask substrate (or mask) used for manufacturing a semiconductor or the like will be described as one example of a "sample" on which a drawing pattern is to be drawn.

In the present specification, "drawing data" is basic data of a pattern to be drawn on the sample. The drawing data is data obtained by converting a format of design data generated through a CAD or the like by a designer, such that arithmetic processing can be performed within a drawing apparatus. A drawing pattern such as a figure is defined as coordinates of, for example, an apex of the figure.

Further, in the present specification, "shot" refers to one-time irradiation of charged-particle beam.

Further, in the present specification, "shot density" refers to the number of shots per unit area in the drawing region.

Further, in the present specification, "during drawing" is a concept representing "in the middle of drawing processing" in a broad sense, encompassing a period during which charged-particle beam is actually irradiated on the sample and also a period before and after the irradiation of the charged-particle beam.

Further, in the present specification, "drift correction" refers to a drift correction of charged-particle beam, which is performed based on a diagnosis result of a drift amount. A so-called zero correction, which performs no drift correction because the drift amount is zero or small, is also included in the "drift correction".

An electron beam drawing apparatus according to an embodiment includes: a storage unit configured to store a plurality of time interval patterns defining time intervals during which a diagnosis of a drift amount of electron beam is performed; a drawing unit configured to draw a predetermined drawing pattern on a mask by irradiating the electron beam on a sample; an event information reception unit configured to receive first event information, which triggers a start of the diagnosis of the drift amount of the electron beam and includes information about occurrence of event and type of event; a region information acquisition unit configured to acquire region information specifying a region which is being drawn by the electron beam; a time information interval selection unit configured to select a specific time interval pattern from the plurality of time interval patterns, based on the type of the first event information and the region information; and a drift diagnosis control unit configured to perform the diagnosis of the drift amount of the electron beam, based on a period until second event information, which triggers a next start of the diagnosis of the drift amount of the electron beam and includes information about occurrence of event and type of event, is received after the reception of the first event information, and a specific time interval pattern. After the diagnosis of the drift amount, the drawing unit draws a predetermined drawing pattern on the mask while performing the drift correction of the electron beam, based on the diagnosis result.

The electron beam drawing apparatus of the embodiment, including the above configuration, determines the time interval pattern for performing the drift diagnosis according to the type of the event included in the event information triggering the start of the drift diagnosis and the region where the drawing is performed. In this manner, the time interval for performing the drift diagnosis can be optimized for each drawing region during drawing at each generated event, and therefore, both the high drawing accuracy and the high throughput can be achieved.

FIG. 1 is a conceptual diagram illustrating a configuration of a drawing apparatus according to an embodiment.

In FIG. 1, the drawing apparatus 100 includes a drawing unit 150 and a control unit 160. The drawing apparatus 100 is one example of charged-particle beam drawing apparatuses. The drawing apparatus 100 draws a desired pattern on a sample 101.

The drawing unit 150 includes an electron lens barrel 102 and a drawing chamber 103. An electron gun 201, an illumination lens 202, a blanking (BLK) deflector 212, a blanking (BLK) aperture 214, a first aperture 203, a projection lens 204, a deflector 205, a second aperture 206, an objective lens 207, and a deflector 208 are disposed within the electron lens barrel 102.

Further, an XY stage 105 is movably disposed within the drawing chamber 103. Further, a sample 101 is disposed on the XY stage 105. Examples of the sample 101 include a mask substrate for exposure, which transfers a pattern to a wafer. The mask substrate includes mask blanks which are not yet drawn.

The control unit 160 includes an input unit 111, a driving circuit 108, memories 109, 152 and 154, a deflection control circuit 110, digital/analog converters (DACs) 112, 114 and 116, a control computer 120, and a memory 121. The control computer 120 has functions of an event information reception unit 122, a region information acquisition unit 124, a time interval pattern selection unit 126, a drift diagnosis control unit 128, and the like.

Drawing data stored in the memory 109 is input to the control computer 120. Information input to the control computer 120 or information during and after arithmetic processing is stored in the memory 121 each time. Further, a drawing program for performing a drawing on the control computer 120 is stored in the memory 154.

The memory 121, the deflection control circuit 110, the memories 109, 152 and 154, the driving circuit 108, and the like are connected to the control computer 120 through buses. The deflection control circuit 110 is connected to the DACs 112, 114 and 116. The DAC 112 is connected to the BLK deflector 212. The DAC 114 is connected to the deflector 205. The DAC 116 is connected to the deflector 208.

Electron beam 200 is irradiated from the electron gun 201 which is one example of an irradiation unit. The electron beam 200 output from the electron gun 201 illuminates the entirety of the first aperture 203 having a rectangular hole by the illumination lens 202.

First, the electron beam 200 is formed in a rectangular shape. The electron beam 200 of a first aperture image passing through the first aperture 203 is projected on the second aperture 206 by the projection lens 204. In this manner, a position of the first aperture image on the second aperture 206 may be controlled by the deflector 205 to change a beam shape and dimension. As a result, the electron beam 200 is formed.

The electron beam 200 on a second aperture image passing through the second aperture 206 is focused by the objective lens 207 and is deflected by the deflector 208. As a result, the electron beam 200 is irradiated on a desired position of the sample 101 placed on the continuously moving XY stage 105. The movement of the XY stage 105 is driven by the driving circuit 108. A deflection voltage of the deflector 205 is controlled by the deflection control circuit 110 and the DAC 114. A deflection voltage of the deflector 208 is controlled by the deflection control circuit 110 and the DAC 116.

When having reached irradiation time t at which a desired amount of irradiation is incident on the sample 101, the electron beam 200 on the sample 101 is blanked as follows. That is, in order to prevent the electron beam 200 from being irradiated on the sample 101 beyond necessity, for example, the electron beam 200 is deflected toward the electrostatic BLK deflector 212 and simultaneously the electron beam 200 is cut by the BLK aperture 214. Therefore, the electron beam 200 does not reach the top surface of the sample 101. A deflection voltage of the BLK deflector 212 is controlled by the deflection control circuit 110 and the DAC 112.

In the case of beam ON (blanking OFF), the electron beam 200 output from the electron gun 201 travels along a trajectory indicated by a solid line in FIG. 1. On the other hand, in the case of beam OFF (blanking ON), the electron beam 200 output from the electron gun 201 travels along a trajectory indicated by a dashed line in FIG. 1. Further, air is evacuated from the inside of the electron lens barrel 102 and the inside of the drawing chamber 103 by a vacuum pump (not illustrated). Therefore, the inside of the electron lens barrel 102 and the inside of the drawing chamber 103 are in a vacuum atmosphere which has a pressure lower than atmospheric pressure.

Using the drawing apparatus 100 having the above configuration, a drawing pattern is drawn on the mask substrate 101.

In FIG. 1, constituent parts necessary for describing the present embodiment are described. It is apparent that the drawing apparatus 100 may further include other necessary components.

Further, in FIG. 1, the control computer 120 as one example of a computer is described as processing the respective functions of the event information reception unit 122, the region information acquisition unit 124, the time interval pattern selection unit 126, and the drift diagnosis control unit 128, but is not limited thereto. For example, the functions may be performed by hardware such as an electrical circuit. Alternatively, the functions may be performed by a combination of hardware such as an electric circuit and software. Alternatively, the functions may be performed by a combination of such hardware and a firmware.

Next, an electron beam drawing method using the drawing apparatus 100 will be described with reference to a process flow of a drawing method illustrated in FIG. 2.

An electron beam drawing method according to an embodiment stores a plurality of time interval patterns defining time intervals during which a diagnosis of a drift amount of electron beam is performed, and draws a predetermined drawing pattern on a mask by irradiating the electron beam on a sample. The electron beam drawing method receives first event information, which triggers a start of the diagnosis of the drift amount of the electron beam and includes information about occurrence of event and type of event, acquires region information specifying a region which is being drawn by the electron beam, and selects a specific time interval pattern from the plurality of time interval patterns, based on the type of the event of the first event information, and the region information. The electron beam drawing method intermittently performs the diagnosis of the drift amount of the electron beam, based on a period until second event information, which triggers a next start of the diagnosis of the drift amount of the electron beam and includes information about occurrence of event and type of event, is received after the reception of the first event information, and a specific time interval pattern, and draws a predetermined drawing pattern on the mask while performing the drift correction of the electron beam, based on each diagnosis result.

Figure 3:
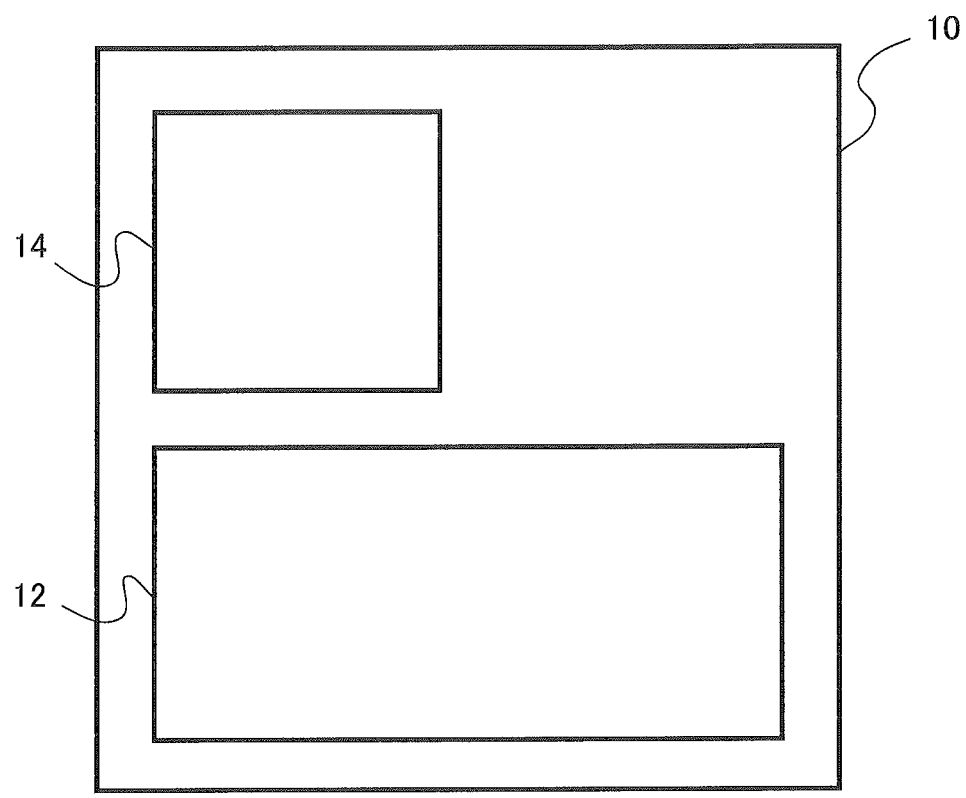
FIG. 3 is a conceptual diagram of a drawing region according to an embodiment.

FIG. 3 is a conceptual diagram of a drawing region according to an embodiment. A drawing region 10 to be drawn on the mask, which is one example of the sample, includes a first region 12 and a second region 14. For example, since a minimum dimension of a drawing pattern of the second region 14 is smaller than a minimum dimension of a drawing pattern of the first region 12, high drawing accuracy is required.

Figure 4A:
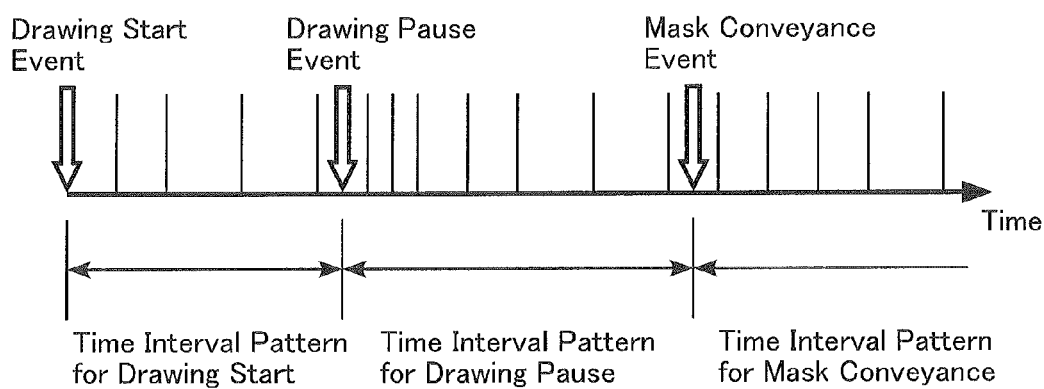
FIGS. 4A and 4B are diagrams illustrating one example of a time interval pattern selection according to an embodiment.
Figure 4B:
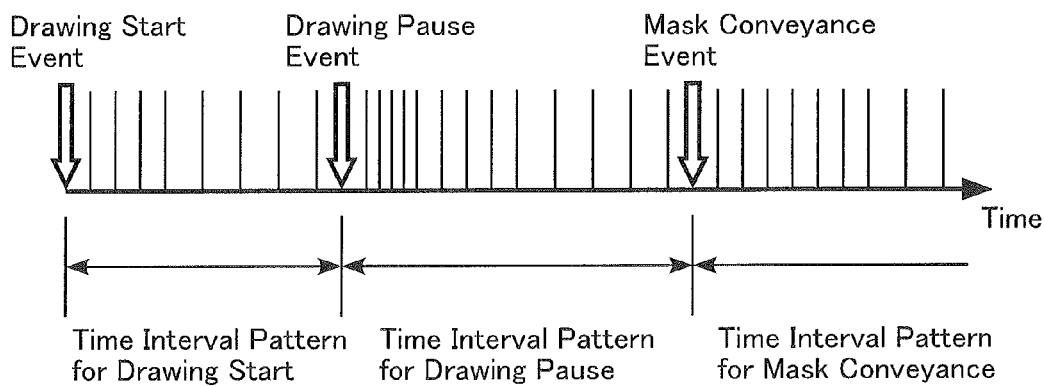

FIGS. 4A and 4B are diagrams illustrating one example of time interval pattern selection according to an embodiment. FIG. 4A illustrates a time interval pattern selection to be applied to the first region 12, and FIG. 4B illustrates a time interval pattern selection to be applied to the second region 14.

First, the control computer 120 loads drawing data from the memory 109. For example, the drawing data is imported from the input unit 111 to the drawing apparatus 100. The input unit 111 is one example of input means. For example, the input unit 111 is a reading device which reads information from an external memory.

Subsequently, the plurality of time interval patterns (interval patterns) defining time intervals during which the diagnosis of the drift amount of the electron beam is input from, for example, the input unit 111, and is stored in the memory 152, which is one example of the time interval pattern unit (S1: time interval pattern storage process). The time interval pattern defines the time interval of the drift diagnosis which is performed by pausing the drawing during the drawing.

Subsequently, the drawing pattern based on the drawing data is drawn on the mask 101 by irradiating the electron beam 200 from the electron gun 201, which is one example of the irradiation unit, to the mask 101 (S2: drawing process).

When the first event, which triggers the start of the diagnosis of the drift amount of the electron beam, occurs, the event information reception unit 122 receives the first event information (S3: event information reception process). In the event, the type exists. The first event information includes information about the type of the event and information about the occurrence of the event.

As illustrated in FIGS. 4A and 4B, examples of the type of the event include a drawing start event at the time of starting the drawing, a drawing pause event of pausing the drawing due to a user's situation or the like, and a mask conveyance event at the time of starting conveying other mask to the inside of the drawing apparatus 100. Furthermore, for example, the event may be the start of drawing ID patterns such as a product number of a mask, and may be a timing at which the drawing process is transferred from a specific region to a next specific region among the drawing regions. The type of the event may be arbitrarily set. The event may automatically occur, or may artificially occur like the pause event.

Subsequently, the region information acquisition unit 124 acquires the region information specifying the region being currently drawn by the electron beam (S4: region information acquisition process). In the example of FIG. 3, the region information is information specifying which region is drawn among the first region 12, the second region 14, and other regions.

Subsequently, the time interval pattern selection unit 126 selects a specific time interval pattern from the plurality of time interval patterns stored in the memory 152, based on the type of the event in the received first event information and the region information capable of specifying which region is drawn (S5: time interval pattern selection process).

The reason for changing the time interval pattern by the type of the event is as follows. For example, in the case of the pause event of pausing the drawing process due to a user's situation, the pause period is long, and therefore, the drift amount after the drawing start may be increased. Therefore, after resuming the drawing, it is desirable to perform the drift diagnosis at short time intervals. On the other hand, like the mask conveyance event, in the case where the drawing stop time is previously specified, and in particular, there is no concern about the increase in the drift amount, it is desirable to minimize the degradation in the throughput of the drawing process by performing the drift diagnosis at time intervals relatively longer than the pause event.

Further, the reason for changing the time interval pattern according to the region is as follows. For example, like the second region 14 of FIG. 3, in the case of the region where the minimum dimension of the drawing pattern is small, the allowable range of the drift amount is narrowed. Therefore, it is desirable to ensure high drawing accuracy by shortening the time interval of the drift diagnosis as compared with the first region 12 having a large minimum dimension.

Therefore, the time interval pattern selection unit 126 selects a specific time interval pattern from the plurality of time interval patterns, based on the type of the event and the attribute of the region being drawn. Further, the attribute of the region, such as the minimum dimension value, may be described in the region information itself, or may be stored in the separate drawing apparatus 100 so as to be linkable to the region information.

Subsequently, the diagnosis of the drift amount of the electron beam is performed, based on the period until the second event information, which triggers a next start of the diagnosis of the drift amount of the electron beam, is received after the reception of the first event information, and the selected specific time interval pattern. A predetermined pattern is drawn on the mask 101, while performing the drift correction based on the diagnosis result of the drift amount. The control of the time interval of the drift diagnosis is performed by the drift diagnosis control unit 128. The drift diagnosis is performed each time in a state where the drawing of the pattern is stopped.

Figure 2:
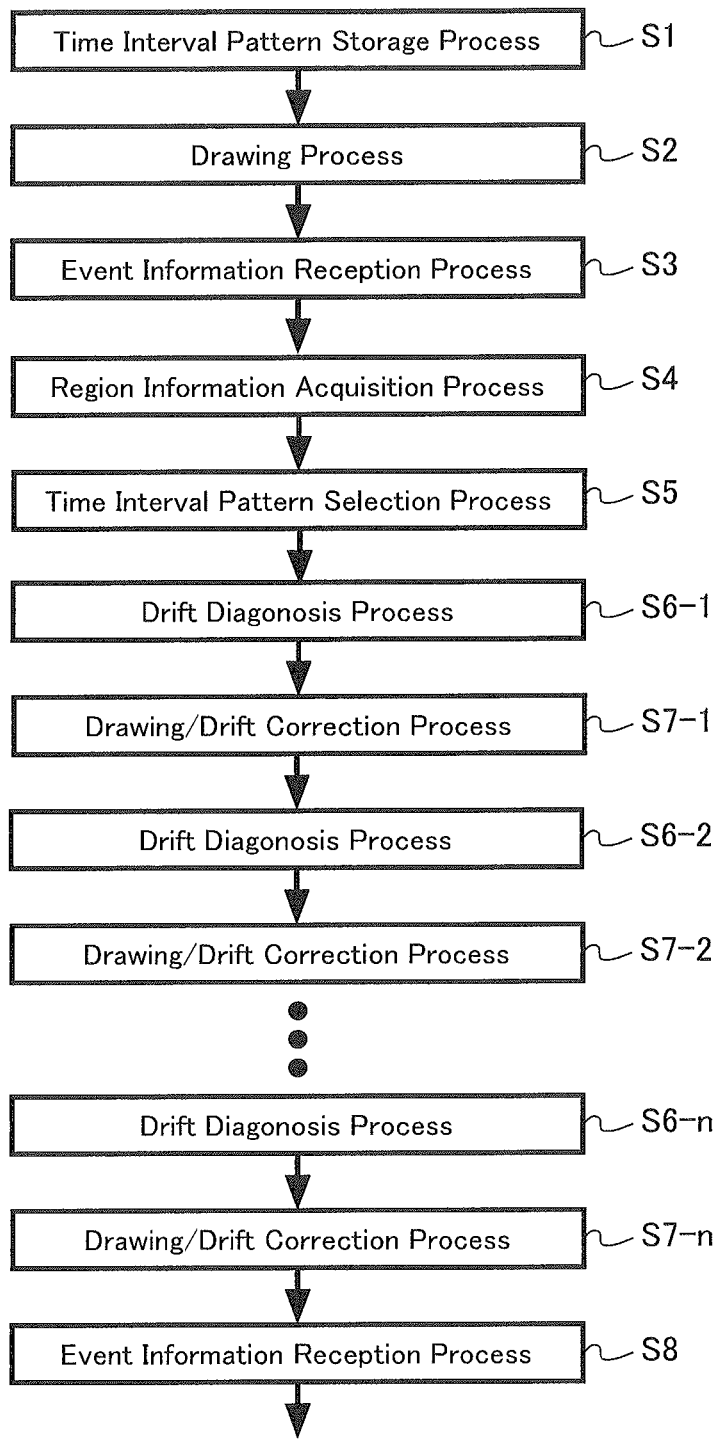
FIG. 2 is a diagram illustrating a process flow of a drawing method according to an embodiment.

That is, as illustrated in FIG. 2, the drift diagnosis process S6-*k* and the drawing/drift correction process S7-*k* (where k is a natural number from 1 to n) are repeated between the event information reception process S3 to the next event information reception process S8.

For example, in the case of the drawing region 10 illustrated in FIG. 3, the time interval pattern of the drift diagnosis with respect to the event as illustrated in FIG. 4A is selected and performed on the first region 12 having a relatively large minimum dimension. That is, when the drawing start event occurs, the time interval pattern for starting the drawing is selected and performed. When the drawing pause event occurs, the time interval pattern for pausing the drawing, which has a relatively short time interval, is selected and performed. When the mask conveyance event occurs, the time interval pattern for conveying the mask is selected and performed.

Further, each of the vertical bars on the time axis represents one-time drift diagnosis. As illustrated in the drawing, it is desirable to adopt the time interval pattern, of which the time interval increases with the lapse of time from the occurrence of the event. This is because immediately after the event, it is most likely that the drift amount will increase.

The time interval pattern of the drift diagnosis with respect to the event as illustrated in FIG. 4B is selected and performed on the second region 14 having a relatively small minimum dimension. That is, even when the same event as the first region 12 occurs, the time interval pattern, of which the time interval of the drift diagnosis is shorter than the first region 12, is selected.

The drift diagnosis method is not specially limited. However, for example, after the drawing is stopped, the drift diagnosis method is performed by irradiating the electron beam on a reference mark for drift diagnosis, which is fixed on the XY stage 105, and measuring a deviation from a desired beam position. As a result of the drift diagnosis, the correction of the beam irradiation position, so-called drift correction, is performed according to the obtained drift amount. For example, the drift correction is performed by correcting deflection sensitivity coefficients of the DACs 112, 114 and 116. In this manner, the pattern drawing after the drift diagnosis is performed while the drift correction is performed based on the result of the drift diagnosis.

Note that, in the drift correction, it is desirable that the drift amount obtained in the drift diagnosis is corrected not at once but stepwise or continuously during the drawing, in terms of preventing the drawn pattern from being discontinuous.

An electron beam drawing program of the embodiment is a program causing the electron beam drawing method to be executed on a computer mounted on the drawing apparatus 100. The control computer 120 is one example of the computer.

Specifically, the electron beam drawing program is a program causing the electron beam drawing method to be executed on the computer mounted on the drawing apparatus 100, the electron beam drawing method including: storing a plurality of time interval patterns defining time intervals during which a diagnosis of a drift amount of electron beam is performed; drawing a predetermined drawing pattern on a mask by irradiating the electron beam on a mask; receiving first event information, which triggers a start of the diagnosis of the drift amount of the electron beam and includes information about occurrence of event and type of event; acquiring region information specifying a region which is being drawn by the electron beam; selecting a specific time interval pattern from the plurality of time interval patterns, based on the type of the event of the first event information and the region information; performing the diagnosis of the drift amount of the electron beam, based on a period until second event information, which triggers a next start of the diagnosis of the drift amount of the electron beam and includes information about occurrence of event and type of event, is received after the reception of the first event information, and a specific time interval pattern; and drawing a predetermined drawing pattern on the mask while performing the drift correction of the electron beam, based on the diagnosis result.

This program is stored in computer-readable recording media, such as a magnetic disk device, a magnetic tape device, an FD, or a read only memory (ROM). The recording media of the embodiment is a non-transitory tangible computer readable media, which does not include a transmission media.

In the above description, processing contents or operation contents described as "~unit" or "~process" may be realized by the program which can be operated by the computer. Alternatively, the processing contents or operation contents may be executed by a combination of hardware and software, as well as software program. Alternatively, the processing contents or operation contents may be combined with firmware. Further, in the case where the processing contents or operation contents are configured by the program, the program is recorded in a recording medium, such as a magnetic disk device, a magnetic tape device, an FD, or a read only memory (ROM). For example, the program is recorded in the memory 121.

Further, the control computer 120 being the computer may be connected to a random access memory (RAM), a ROM, or a magnetic disk (HD) device, which is one example of a storage device, a keyboard (K/B) or a mouse, which is one example of an input unit, a monitor or a printer, which is one example of an output unit, or an external interface (I/F), an FD, a DVD, a CD, or the like which is one example of an input/output unit, through buses (not illustrated).

According to the electron beam drawing method, the electron beam drawing program, and the electron beam drawing apparatus according to the embodiments, the time interval pattern for performing the drift diagnosis is determined according to the type of the event information, which triggers the start of the drift diagnosis, and the region being drawn. Accordingly, since the time interval for performing the drift diagnosis can be optimized for each drawing region at each event, both the high drawing accuracy and the high throughput can be achieved.

The embodiments have been described above with reference to the specific examples. However, the present disclosure is not limited to these specific examples.

For example, in the embodiments, the case where the specific time interval pattern is selected based on the minimum dimension of the drawing pattern in the region has been exemplarily described. However, for example, the specific time interval pattern may be selected based on the shot density of the region. This method is desirable when the magnitude of the drift amount is changed according to the shot density. Further, the specific time interval pattern may be selected based on the amount of beam irradiation per unit area of the region. This method is desirable when the magnitude of the drift amount is changed according to the amount of beam irradiation per unit area.

Further, in the embodiments, the case where there are two regions in the drawing region 10 has been exemplarily described, but the number of the regions is not limited to two.

Further, parts which are not directly necessary for description of the present disclosure, such as a device configuration or control method, have not been described, but a necessary device configuration or control method can be appropriately selected and used. For example, details about the configuration of the control unit configured to control the charged-particle beam drawing apparatus have not been described, but it is apparent that a necessary configuration of the control unit can be appropriately selected and used.

All charged-particle beam drawing methods, computer-readable recording media, and charged-particle beam drawing apparatuses, which include the elements of the present disclosure and can be appropriately designed and modified by a person with ordinary skill in the art, fall within the scope of the present disclosure.

What is claimed is:

1. A charged-particle beam drawing apparatus comprising:
a storage unit configured to store a plurality of time interval patterns which define time intervals between performing a diagnosis of a drift amount of a charged-particle beam;
an event information reception unit configured to receive first event information including an occurrence of event and a type of event;
a region information acquisition unit configured to acquire region information specifying a region being drawn by the charged-particle beam;
a time interval pattern selection unit configured to select a specific time interval pattern from the plurality of time interval patterns based on at least the region information and the type of the event in the first event information;
a drift diagnosis control unit configured to diagnose the drift amount of the charged-particle beam at the time intervals defined in the specific time interval pattern after reception of the first event information until second event information is received; and
a drawing unit configured to draw a predetermined drawing pattern using a drift correction of the charged-particle beam based on diagnosis of the drift amount performed by the drift diagnosis control unit.

2. The charged-particle beam drawing apparatus according to claim 1, wherein the time interval pattern selection unit selects the specific time interval pattern according to a minimum dimension of the drawing pattern of the region.

3. The charged-particle beam drawing apparatus according to claim 1, wherein the time interval pattern selection unit selects the specific time interval pattern according to a shot density of the region.

4. The charged-particle beam drawing apparatus according to claim 1, wherein the event corresponds to drawing start, drawing pause, or mask conveyance start.

5. The charged-particle beam drawing apparatus according to claim 1, wherein the charged-particle beam is an electron beam.

6. The charged-particle beam drawing apparatus according to claim 1, wherein the specific time interval pattern includes intervals of different lengths.

\* \* \* \* \*